United States Patent [19]

Kasuboski

[11] Patent Number: 5,349,294
[45] Date of Patent: Sep. 20, 1994

[54] TWO AND THREE-DIMENSIONALLY SELECTIVE RF PULSES FOR MAGNETIC RESONANCE IMAGING

[75] Inventor: Larry Kasuboski, Solon, Ohio

[73] Assignee: Picker International Inc., Highland Hts., Ohio

[21] Appl. No.: 60,860

[22] Filed: May 12, 1993

[51] Int. Cl.$^5$ ............................................ G01R 33/20
[52] U.S. Cl. .................................................. 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,793,356 | 12/1988 | Misic et al. ........................ | 128/653 |
| 4,985,677 | 1/1991 | Pauly .................................. | 324/309 |
| 5,025,216 | 6/1991 | Pauly .................................. | 324/309 |
| 5,061,897 | 10/1991 | Danby et al. ..................... | 324/318 |
| 5,105,152 | 4/1992 | Pauly .................................. | 324/309 |
| 5,124,651 | 6/1992 | Danby et al. ..................... | 324/318 |
| 5,235,276 | 8/1993 | Lew .................................... | 324/306 |

OTHER PUBLICATIONS

"Volume-Selective Excitation: A Novel Approach to Topical NMR", Aue, et al. J. Mag. Reson. vol. 56, pp. 350–354 (1984).
"A k-Space Analysis of Small-Tip-Angle Excitation", Pauly, et al., J. Mag. Reson. vol. 81, pp. 43–56 (1989).
"Correcting for Nonuniform k-Space Sampling in Two-Dimensional NMR Selective Excitation", Hardy, et al., J. Mag. Reson. vol. 87, pp. 639–645 (1990).
"New Spatial Localization Method Using Pulsed High--Order Field Gradients (SHOT: Selection with High--Order Gradient), " Oh, et al., Mag. Reson. in Medicine, vol. 18, pp. 63–70 (1991).
"A Three-Dimensional $\pi$ Pulse", Pauly, et al., SMRM Book of Abstracts, vol. 2, p. 493, (1991).
"Region of Interest Selection by Outer Volume Saturation", Crespigny, et al. (1989).

Primary Examiner—Michael J. Tokar
Attorney, Agent, or Firm—Fay, Sharpe, Beall, Fagan, Minnich & McKee

[57] ABSTRACT

A sequence controller (30) controls gradient pulse amplifiers (20) and a digital transmitter (24) to apply a conventional magnetic resonance imaging or spectroscopy sequence. One or more of the resonance excitation pulses includes a series of very small tip angle RF pulses (52, 70) applied in rapid succession substantially within the time interval of a normal RF excitation pulse (e.g. 10 msec.). A series of gradient pulses (58x, 58y, 72y, 72z) with linearly diminishing amplitudes and a repetition cycle that is an integer multiple of the duration of the very small tip angle RF pulses are applied such that an excitation trajectory in k-space follows a piecewise linear square spiral (FIG. 3) when gradients are applied along two axes or an octahedral spiral (FIG. 6) when a series of gradient pulses are applied along three axes. The subregion of resonance excitation is selectively shifted along one of the axes by applying a series of frequency offset pulses (66, 76) along one or more of the axes. In this manner, the position of the subregion of resonance excitation is shifted without changing the phase component of the RF pulses.

21 Claims, 12 Drawing Sheets

TWO AND THREE-DIMENSIONALLY SELECTIVE RF PULSES FOR MAGNETIC RESONANCE IMAGING

BACKGROUND OF THE INVENTION

The present invention relates to the magnetic resonance imaging and spectroscopy arts. It finds particular application in conjunction with dark blood flow tagging for angiographic imaging and will be described with particular reference thereto. However, it should be appreciated that the invention will also find application in connection with magnetic resonance excitation for other magnetic resonance applications.

It is well-known in the magnetic resonance arts that resonance can be excited in a planar region or slice by the simultaneous application of a selective RF pulse and static magnetic field gradient. This selective RF/static magnetic field gradient has been used to create localized excitation in a slice or planar region. This combination of selective RF pulse and static magnetic field gradient has been used in angiographic imaging for flow tagging. Typically, magnetic resonance was excited or saturated in a slice or slices adjacent a planar region or slice of interest. A series of RF pulses applied with a series of static gradients have been used to excite resonance or saturate blood in a plurality of slices or regions around the region of interest.

When a conventional imaging sequence was performed on the slice or other region of interest, the non-blood tissue was imaged normally. However, the blood which was tagged by prior excitation or saturation had different magnetic resonance imaging properties than blood which was not previously excited or saturated. As the blood from the adjacent slice(s) flows into the slice or region of interest, it changes the properties of the blood tissue displayed in the resultant image. This enables the resultant diagnostic images to be used to measure flow, measure flow rate, track flow paths, and the like.

One of the problems with tagging an entire region or plane is that it tagged not only the blood flow of interest but also blood flow which was not of interest. The plane typically extended across the examination region, tagging blood flow in portions of the patient that were not undergoing diagnostic examination. When the tagged blood from these remote regions flowed into the region of interest, the tagged blood of interest and the tagged blood from remote regions was indistinguishable. Accordingly, others sought to restrict the tagging region to a smaller region than the entire slice.

One technique for limiting the tagging region used a series of RF pulses with a series of different static magnetic field gradients to create the desired two-dimensional excitation profile. See for example, "Volume Selective Excitation: A Novel Approach to Topical NMR", W. P. Aue, S. Muller, T. A. Cross, and J. Seelig, J. Mag. Reson. Vol. 56, pp. 350–354, 1984; "Selective Spatial Presaturation of Regions of Tailored Shape", S. Singh, W. Brody, SMRM Book of Abstracts, 1992. These techniques generated a series of small RF pulses which summed together to produce the desired resonance excitation. The excitation region was rotated about the isocenter or other selected point such that there was a constructive superposition at a cylinder through the axis of rotation. The pulses were spread over the other remainder of the region providing negligible superpositions at other points, i.e., negligible resonance excitation.

One of the problems with the creation of a localized region of excitation by the superposition of RF pulses is that the technique is quite time consuming. Further gradient spoilers are commonly required between the individual RF pulses to insure that artifacts to not intrude in the image. The spoiler pulses increase the total time even more. Because the RF pulses were commonly identical and only the gradient direction was changed, excitation outside the volume of interest frequently occurred. Excitation outside the volume of interest could be suppressed by keeping the RF tip angle very low, but low tip angles increase the length of the pulse train even longer.

Other works used a single RF pulse in the presence of a time varying magnetic field gradient. See, "Off-Axis Spatial Localization of Frequency Modulated Nuclear Magnetic Resonance Rotating$\rho$ Pulses", C. J. Hardy, P. A. Bottomley, P. B. Roemer, J. Appl. Phys., Vol. 64, pp. 4741–4743, 1988; "K-Space Analysis of Small-Tip-Angle Excitation", J. Pauly, D. Nishimura, and A. Macovski, J. Mag. Reson., Vol. 81, pp. 43–56, 1989; U.S. Pat. No. 4,985,677 of J. Pauly; and U.S. Pat. No. 5,025,216 of Pauly and Nishimura. In these techniques, the intensity of the RF pulse and the intensity of the gradient field in two dimensions was combined to produce excitation which was localized in two dimensions.

By considering the RF and gradient coils together, a cleaner profile excitation was achieved, but at the expense of far more complicated radio frequency and gradient waveforms. The excitation was tailored to a specific point in space, typically the isocenter of the magnetic field gradients. Moving the region required recalculation of at least the phase profile of the radio frequency signal.

Others have combined portions of the two above-mentioned techniques to decompose trajectories into a series of concentric circles or concentric squares. Other radial patterns, pinwheels, and Lissajous figures have also been used for excitation. These techniques require that suitable attention be paid to the homogeneous coverage of the frequencies of interest. See "Correcting for Non-Uniform K-Space Sampling in Two-Dimensional NMR Selective Excitation", C. J. Hardy, H. E. Cline, P. A. Bottomley, J. Mag. Reson., Vol. 87, pp. 639–645, 1990 and U.S. Pat. No. 5,105,152 of J. Pauly.

These two techniques unified and optimized the RF requirements for the various trajectories. Identical RF pulses were provided for each spoke of a radial or pinwheel trajectory. Similar RF pulses were applied for each concentric square or circle. Again, the point of selective excitation was controlled by the phase of the RF pulses requiring recalculation of the RF pulse phase to shift the selective excitation region.

One problem in common with all of these techniques is that the region of interest was defined in only two dimensions. That is, the region of selected excitation was a cylinder which extended completely across the examination region along the third dimension.

In order to limit the region of selective excitation along the third direction, the Aue, et al. and the Crespigny, et al. articles suggested the creation of three-dimensional excitation profiles by a series of identical RF pulses applied in the presence of different magnetic gradient fields. This again required a relatively long duration because gradient ramping must occur between successive pulses. Further, these methods disturbed spins outside of the 3D volume, disturbing their equilibrium condition.

Another technique for limiting the field of excitation in three dimensions was described in "New Spatial Localization Method Using Pulse High-Order Field Gradients (SHOT: Selection with High-Order gradient)", C. H. Ooh, S. K. Hilal, Z. H. Cho, and I. K. Mun, Mag. Reson. Med., Vol. 18, pp. 63–70, 1991. This technique required high order, i.e. non-linear, pulsed magnetic field gradients to perform the volume selection. Selecting these gradients was again computationally intensive.

Another technique for limiting the excitation region was described in "A Three-Dimensional$\pi$Pulse", J. Pauly, D. Nishimura, A. Macovski, SMRM 10th Annual Meeting, Book of Abstracts, Vol. 2, p. 493, 1991. This technique extended the two-dimensional pulse sequence of the previously discussed Pauly, Nishimura, and Macovski article in a third dimension but retained many of the drawbacks discussed above. Further, this technique required an inversion pulse in each repetition rather than an excitation pulse. That is, in order to control the localized excitation region in three dimensions, the prior art performed a succession of two-dimensional localization techniques in adjoining planes.

The present invention provides a new and improved magnetic resonance imaging and spectroscopy technique which facilitates limiting a region of excitation in three dimensions and which facilitates positioning a two or three-dimensional localized excitation region.

SUMMARY OF THE INVENTION

In accordance with one aspect of the present invention, a method of exciting magnetic resonance in a limited region is provided. A series of radio frequency pulses and a series of x and y-gradient pulses are applied such that a k-space trajectory of resonance excitation follows a piecewise linear spiral trajectory. The sum of the RF pulses produces a desired net tip angle.

In accordance with another aspect of the present invention, z-gradient pulses are applied in addition to the x and y-gradient pulses such that the k-space trajectory includes a plurality of piecewise linear trajectories among corners of an octahedral.

In accordance with another aspect of the present invention, a frequency offset is applied concurrently with the radio frequency and gradient pulses to shift the location of excitation within the examination region.

In accordance with a more limited aspect of the present invention, the frequency offset includes applying a series of gradient field pulses along one of the x, y, and z-axes.

In accordance with another aspect of the present invention, the series of gradient pulses along each axis diminishes linearly with each repetition such that the piecewise k-space trajectory spirals inward and wherein the offset pulses diminish in amplitude analogously.

In accordance with another aspect of the present invention, a method of exciting magnetic resonance in a three-dimensionally limited region is provided. A series of radio frequency pulses is applied in a duration comparable with a duration for exciting magnetic resonance in conventional magnetic resonance experiments, the sum of the series of magnetic resonance pulses controlling the magnetic resonance tip angle. Concurrently with the series of radio frequency pulses, applying a series of gradient pulses are applied along x, y, and z-axes, the x, y, and z-gradient pulses decreasing in amplitude with each repetition such that a k-space trajectory spirals in three dimensions analogous to the winding pattern of a ball of string.

One advantage of the present invention is that it enables the location of the limited magnetic resonance excitation region to be shifted physically without recalculating and adjusting phase of the RF signal.

Another advantage of the present invention is that it facilitates defining the limited region of magnetic resonance excitation in three dimensions.

Another advantage of the present invention resides in its high degree of symmetry when defining the region of excitation in three dimensions reducing the amplitude of the side lobes.

Another advantage of the present invention is that it enables magnetic resonance excitation to be limited to a selected area without causing artifacts in other areas.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

FIGS. 2A, 2B, 2C and 2D are illustrative of the series of RF pulses, the series of x-gradients, the series of y-gradients that cause the excitation to follow the trajectory of FIG. 3 in k-space.

DETAILED DESCRIPTION OF THE PREFERRED EMBODIMENTS

Figure 1:
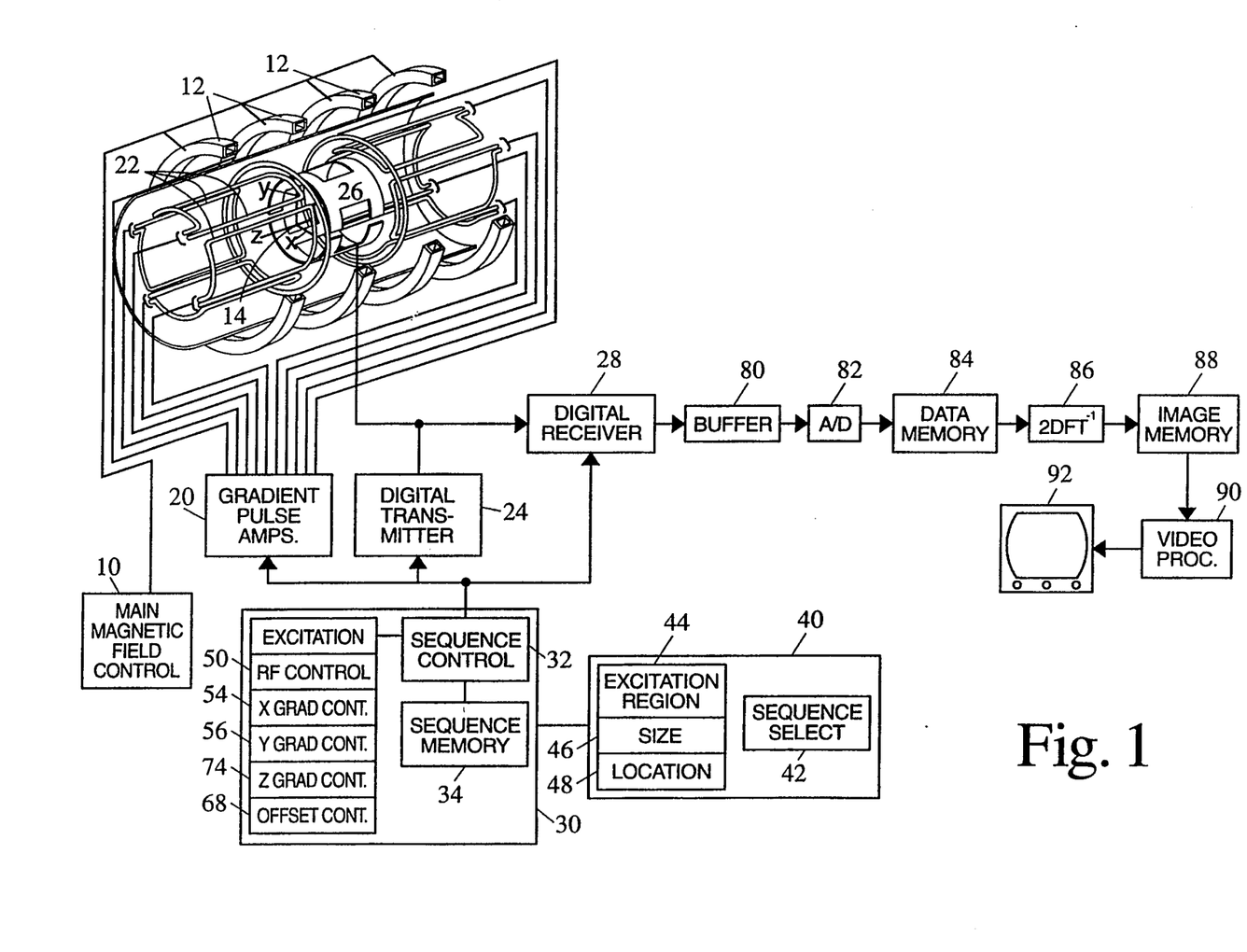
FIG. 1 is a diagrammatic illustration of a magnetic resonance imaging device in accordance with the present invention.

With reference to FIG. 1, a main magnetic field control means 10 controls superconducting or resistive magnets 12 such that a substantially uniform static magnetic field is created along a z-axis through an examination region 14. A magnetic resonance echo generating means applies a series of RF and magnetic field gradient pulses to cause magnetic resonance imaging and spectroscopy sequences, such as field echo sequences, echoplanar sequences, segmented k-space sequences, and the like. More specifically, gradient pulse amplifiers 20 apply current pulses to gradient coils 22 to create magnetic fields along x, y, and z-axes of the examination region 14. A digital radio frequency transmitter 24 transmits radio frequency pulses, including RF pulses composed of a packet of immediately contiguous pulses of short duration, to an RF coil 26 to transmit RF pulses into the examination region. RF pulses are used to saturate, excite resonance, or manipulate resonance in selected portions of the examination region. A digital radio frequency receiver 28 receives radio frequency magnetic resonance signals emanating from the examination region. The resonance signals are picked up by the RF coil 26 or by surface coils (not shown).

A sequence control means 30 controls the gradient pulse amplifiers 20, the digital transmitter 24, and the digital radio frequency receiver 28. More specifically, the control means 30 includes a sequence control means 32 which causes a digital transmitter to transmit appropriate RF pulses and causes the gradient pulse amplifiers 20 to apply appropriate gradient pulses for a selected magnetic resonance imaging or spectroscopy sequence. A sequence memory 34 stores a plurality of magnetic resonance imaging or spectroscopy sequences as are known in the art. Many of the sequences will use conventional RF pulses. A limited resonance excitation selection pulse control means 36 selectively accessed by the sequence control means 32 provide appropriate RF and gradient pulse controls for limiting the RF excitation to a selectable small region. An operator control panel or means 40 includes an appropriate keyboard or other means 42 for selecting among the plurality of sequences in the sequence memory 34. A limited resonance excitation region selection means 44 includes a keyboard, menu, or other appropriate means for selecting the size 46 of the limited region of excitation and means 48 for selecting the location of limited excitation within the examination region.

Figure 2A:
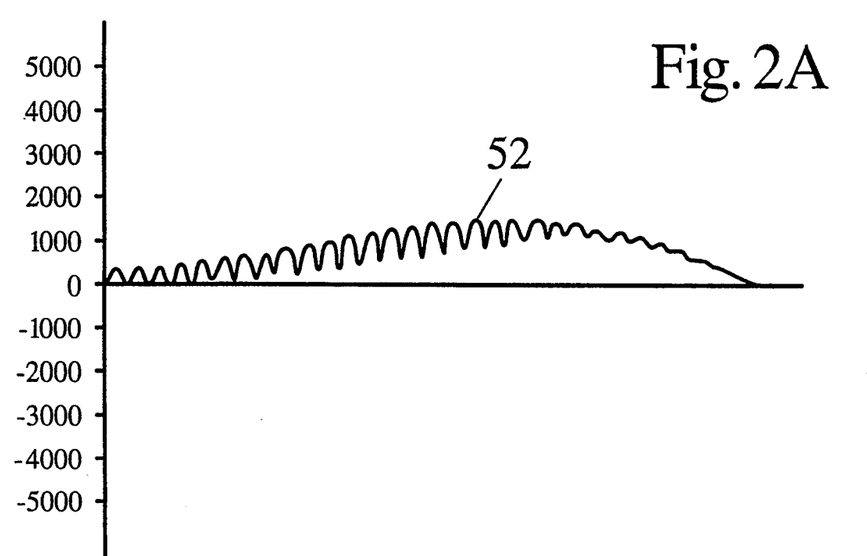
Figure 2B:
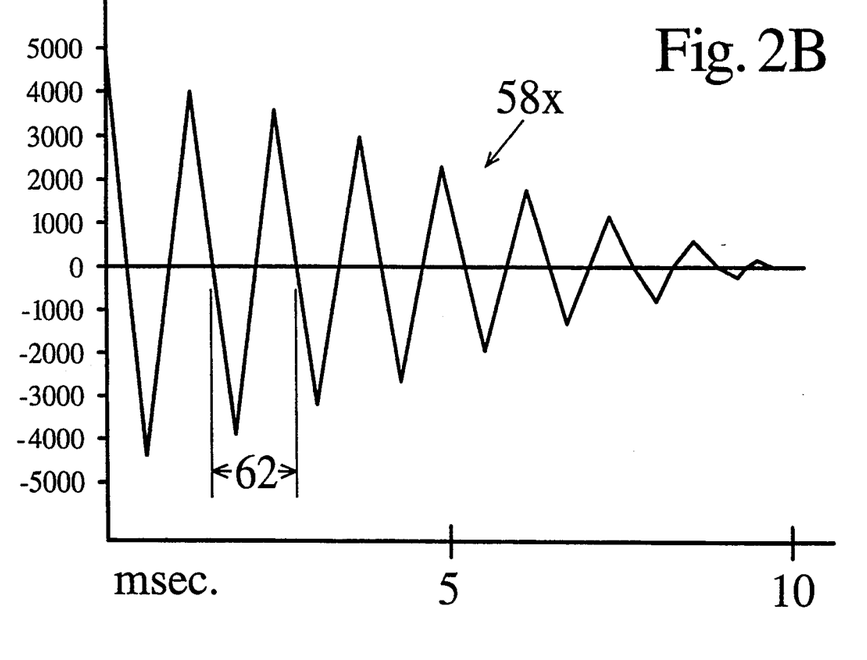
Figure 2C:
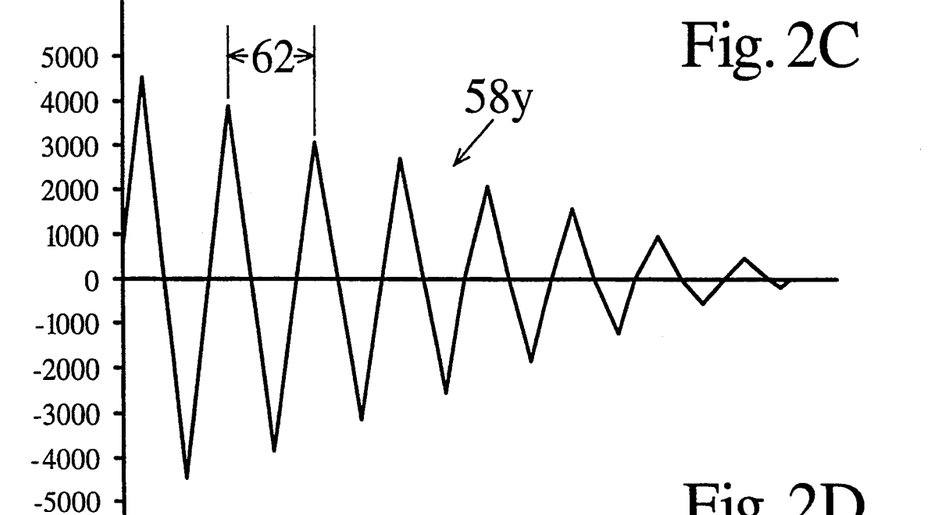

With reference to FIGS. 2A, 2B, and 2C, and continuing reference to FIG. 1, the limited region resonance excitation means 36 includes a radio frequency signal control means 50 for producing a series of very small flip angle RF pulses 52 as illustrated in FIG. 2A. The sequence of small pulses span about 10 msec., i.e. the duration of a conventional RF excitation pulse. The area underneath the curve of FIG. 2A determines the flip angle of the RF pulse. By increasing the amplitude of the FIG. 2A RF pulse, larger flip angles are obtained. An x-gradient control means 54 and a y-gradient control means 56 cause the gradient amplifiers to generate magnetic field gradients 58x and 58y as illustrated in FIGS. 2B and 2C, respectively.

Figure 3:
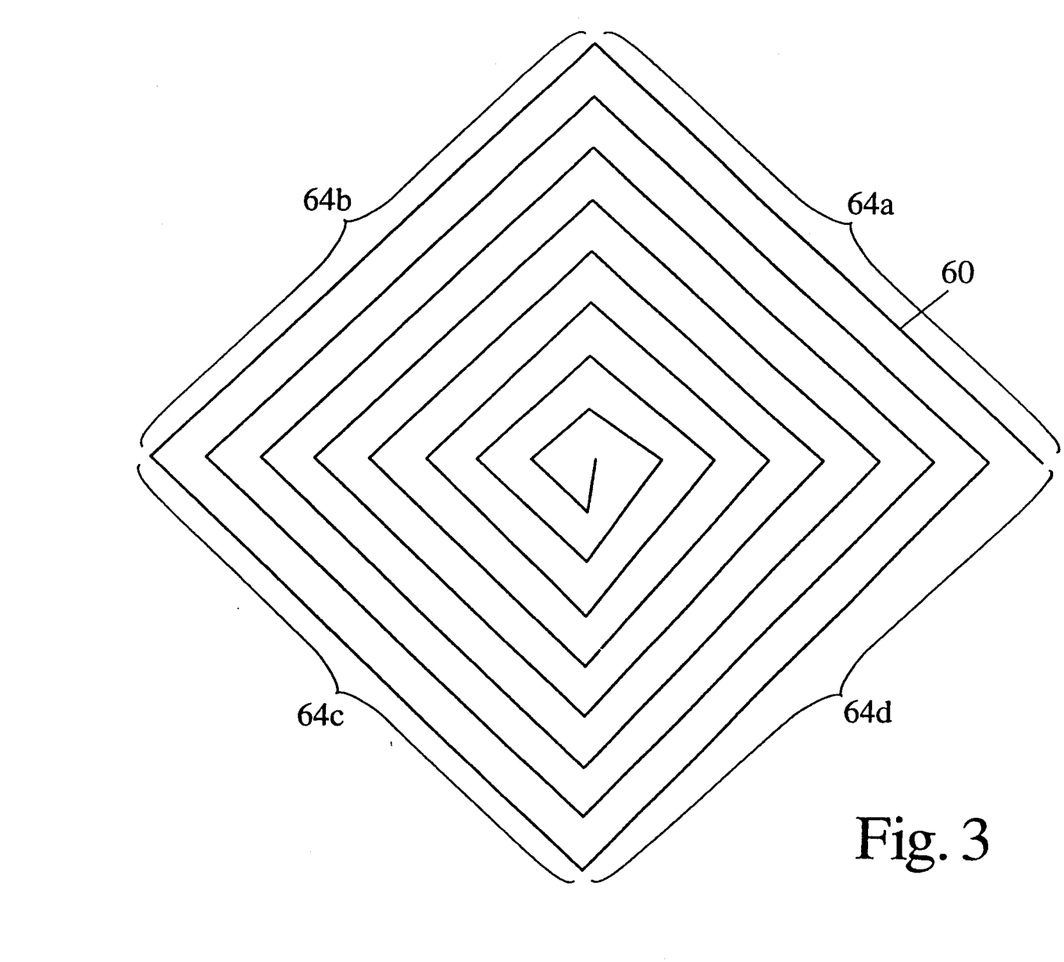
FIG. 3 is a diagrammatic illustration of a piecewise linear spiral trajectory in k-space for a two-dimensional embodiment.
Figure 4:
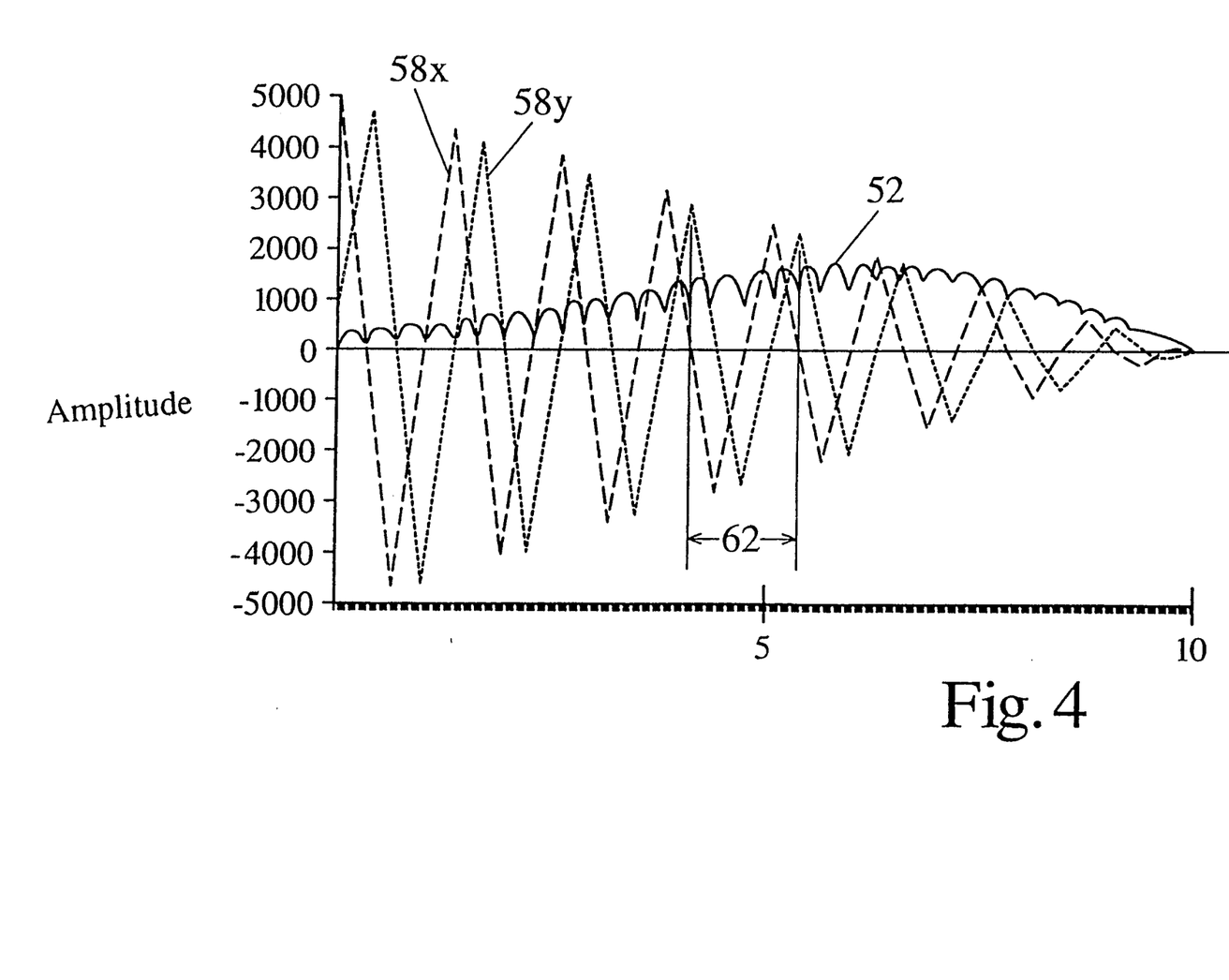
FIG. 4 is a superimposition of the RF and gradient pulses of FIGS. 2A–2D.

With reference to FIG. 3, the RF and gradient pulse sequence described in FIGS. 2A, 2B, and 2C cause a square spiral k-space trajectory 60. FIG. 4 is a superimposition of FIGS. 2A, 2B, and 2C. Each cycle 62 corresponds to the trajectory moving along a first four sides 64a, 64b, 64c, 64d of the square spiral of FIG. 3. Note in FIG. 4 that each pulse of the series of RF pulses in cycle 62 is applied with a different one of four x and y-gradient combinations, thus causing movement along a corresponding one of the four sides of the trajectory. Because the gradients decrease in amplitude with each cycle, the trajectory spirals inward to form the square spiral trajectory.

The square spiral k-space trajectory is translated to Cartesian coordinates $k_x$ and $k_y$ from polar coordinates r and $\theta$ as follows:

$$k_x(t) = A(1-t/T)[b/(\sin\theta - m^*\cos\theta)]^*\cos\theta \qquad (1a),$$

$$k_y(t) = A(1-t/T)[b/(\sin\theta - m^*\cos\theta)]^*\sin\theta \qquad (1b),$$

where:
A is an arbitrary amplitude;
t is the time of the point being calculated;
T is the total time of the gradient waveform;
$\theta$ is the polar angle (0–2$\pi$) of the calculated point;
m and b are the slope and intercept of the sides of the square spiral and are defined as follows:

for: $0 < \theta < \pi/2$ then $m = -1$ $b = +1$
$\pi/2 < \theta < \pi$ then $m = +1$ $b = +1$
$\pi < \theta < 3\pi/2$ then $m = -1$ $b = -1$
$3\pi/2 < \theta < 0$ then $m = +1$ $b = -1$ With this gradient and RF pulse sequence, excitation is limited to a small region at the isocenter of the examination region.

Figure 2D:
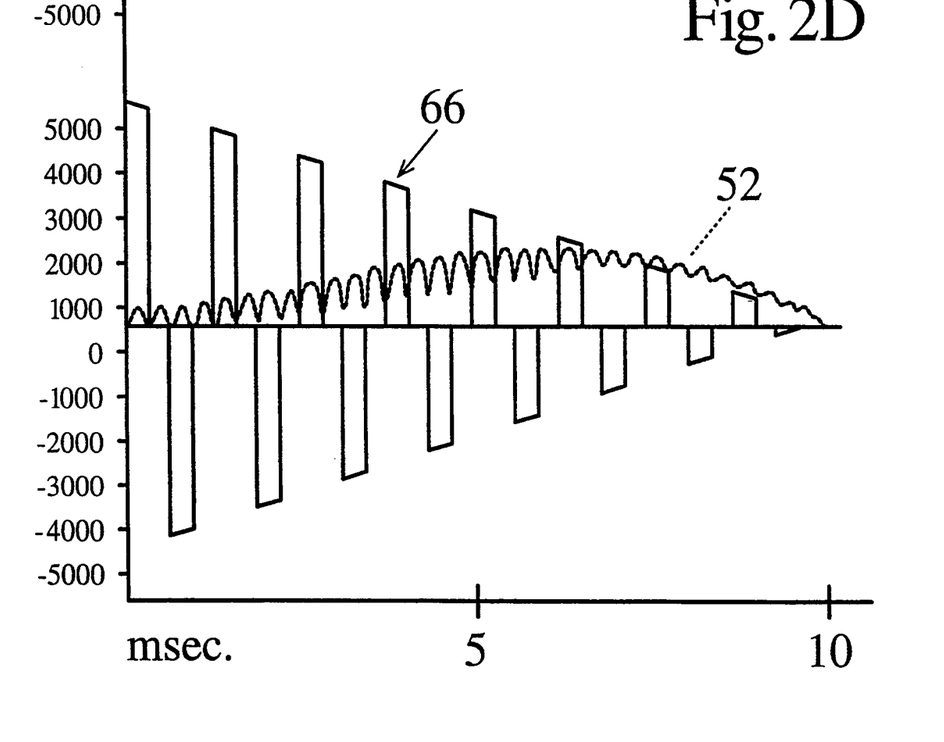
FIG. 2D illustrates frequency offsets for positioning the region of limited magnetic resonance excitation.

With reference to FIG. 2D, unlike the prior art which requires recalculation of the phase or exponential components of the RF signal, the present invention shifts the position of limited excitation within the examination region by applying frequency offset profile 66. The frequency offset profile is calculated with the same equations, except that it is rotated 45° from the gradient waveform, i.e.:

for: $0 < \theta < \pi/2$ then $m = +\infty$ $b = -\infty$
$\pi/2 < \theta < \pi$ then $m = 0$ $b = +1$
$\pi < \theta < 3\pi/2$ then $m = +\infty$ $b = +\infty$
$3\pi/2 < \theta < 0$ then $m = 0$ $b = -1$ The radio frequency pulse $B_1(t)$ is calculated on a point by point basis from the k-space trajectory as follows:

$$B_1(t) = A_{rf} * e^{-\sigma^2(k_x^2 + k_y^2[(2\pi n(1-t/T)^2 + 1)]^{\frac{1}{2}}} \qquad (2).$$

n is the number of cycles in the spiral;
$\sigma$ is the standard deviation of the Gaussian profile;
t and T are defined as above.

For the k-space coverage illustrated in FIG. 3 with an eight turn square spiral trajectory, the gradient waveforms of FIGS. 2B and 2C are calculated by "unwrapping" as a function of time. The radio frequency waveform is then calculated from the trajectory. With reference again to FIG. 4, close inspection of the RF waveform allows identification of a series of RF pulses, each of which are associated with a particular leg of the square spiral profile. From this, the frequency offset profile 66 of FIG. 2D is created. The amount of offset or spatial displacement is adjusted by increasing the size, particularly the amplitude, of the frequency offsets 62. Movement of the resultant two-dimensional excitation pattern is straightforward. The frequency offset is zero on paths through the first and third quadrant, negative in the second quadrant, and positive in the fourth quadrant of FIG. 3. In the illustrated embodiment of FIGS. 2A–2D, offset is negative where the x-gradient goes negative and the offset is positive when the x-gradient goes positive. In this manner, the frequency offset 62 performs an analogous function in a modulated fashion in this two-dimensional case as it performs in a static fashion in a one-dimensional or normal slice select case. The center of the excitation region is shifted along the x-axis by a distance indicated by the operator on the location selection means 48. Exact placement of the subregion of excitation is accomplished by rotating the displacement axis, in the example of FIG. 2D the x-axis, along which the frequency offset 62 is applied to align with the desired excitation region. Once the coordinate system in the examination region is rotated, the amplitude of the offset pulse profile is adjusted by an offset control means 68 translate the subregion within which resonance is excited the selected distance along the offset axis.

Although described in terms of a square spiral, it is to be appreciated that other trajectories which excite two dimensions in k-space with a series of linear sub-trajectories can be translated analogously. Moreover, analogous results can be achieved in three dimensions. That is, with the two-dimensional trajectory, resonance is excited in a parallelepiped region which extends through the region of interest and all the way across the examination region. By rotating or spiraling the trajectory in three dimensions, resonance excitation can be limited to a region which is defined in three dimensions, e.g. a volume which approaches an octahedron. When the trajectory of the three-dimensional spiral is a series of linear subdirectories, the same translation procedure can be applied to adjustably position the subregion of resonance excitation without adjusting the phase or other exponential terms in the RF pulse.

Figure 5:
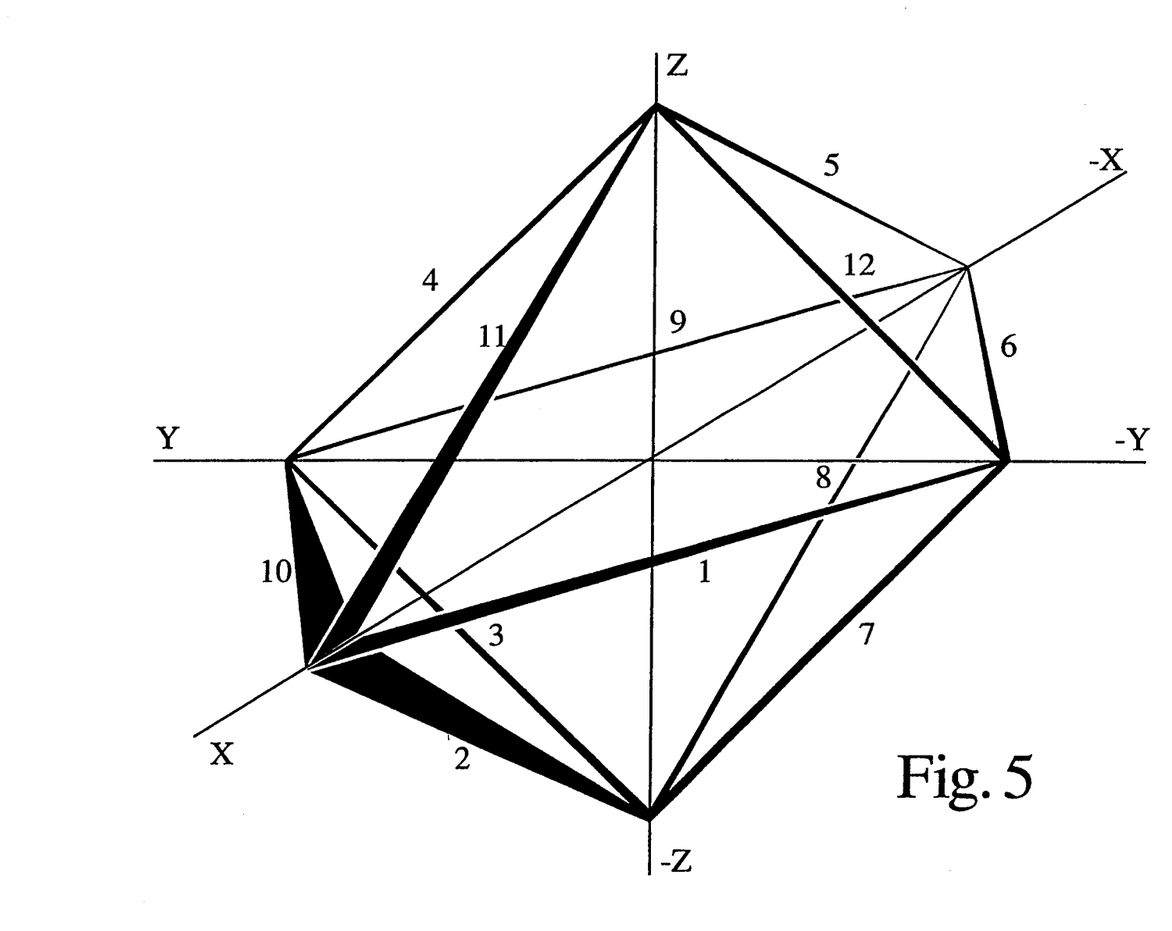
FIG. 5 is a perspective view of a single layer octahedral trajectory in k-space
Figure 6:
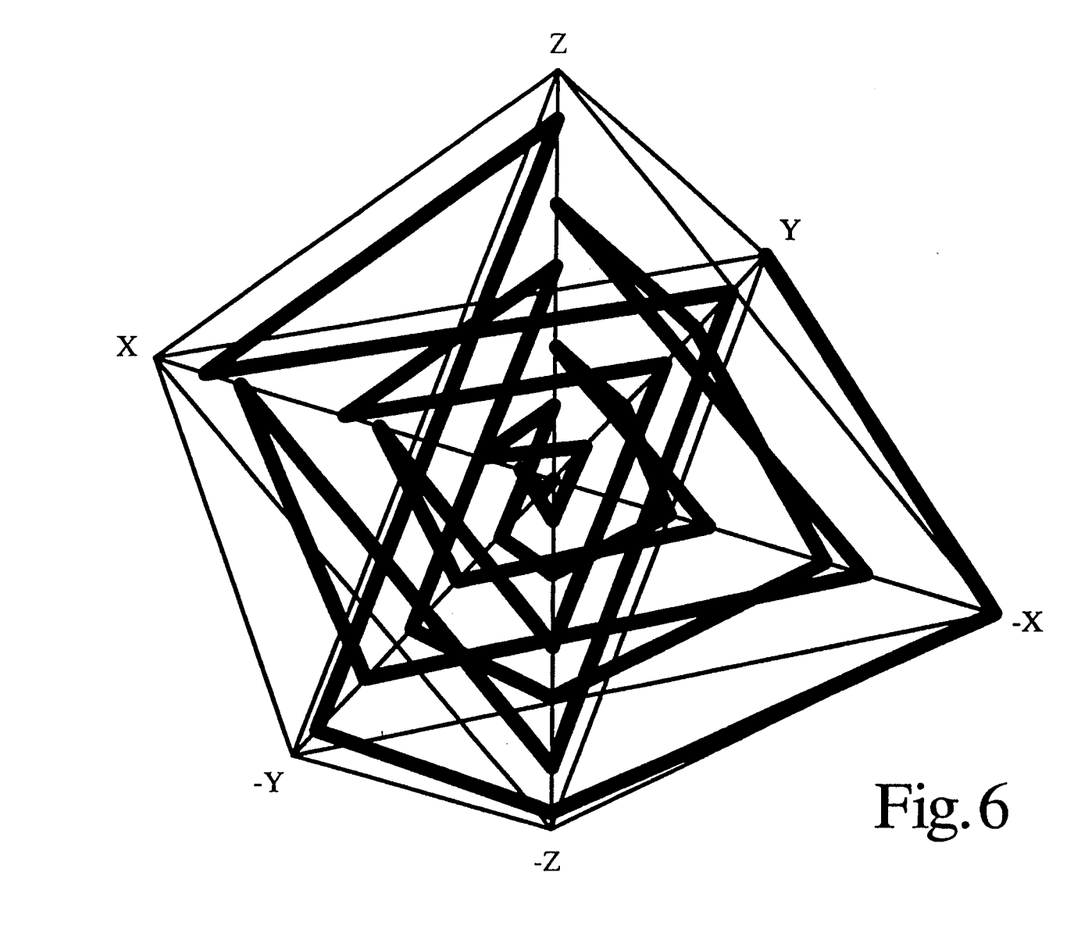
FIG. 6 is a perspective view of a three-dimensional spiral octahedral trajectory in accordance with the present invention.

With reference to FIG. 5, in the preferred three-dimensional embodiment, the k-space trajectory follows an octahedral spiral. FIG. 5 illustrates a single coverage of the octahedral without spiraling inward. Preferably, the gradient amplitudes are decreased with each repetition such that the three-dimensional octahedral spiral of FIG. 6 is created.

Figure 7A:
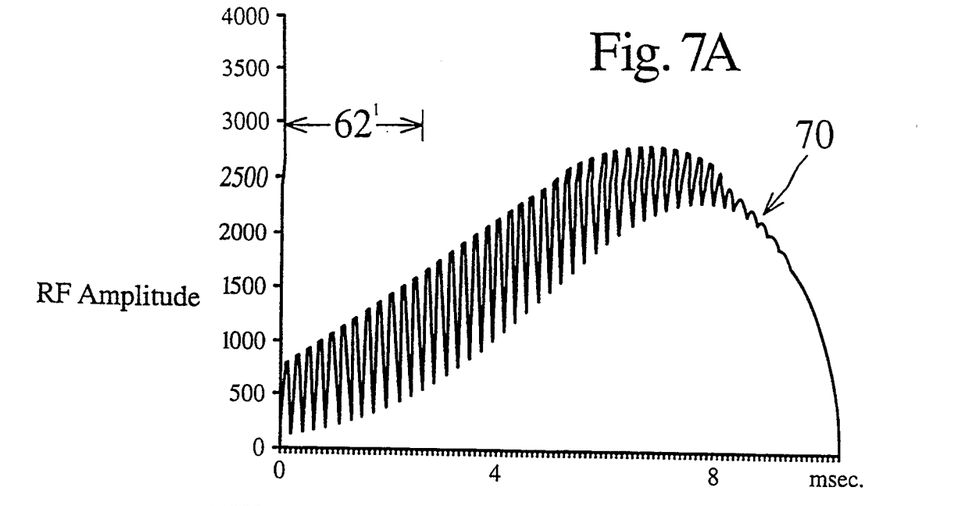
FIGS. 7A, 7B, 7C, and 7D illustrate a series of radio frequency pulses which make up the RF excitation pulse and a series of x, y, and z-gradient pulses which cause the excitation to follow the spiral trajectory of FIG. 6.
Figure 7B:
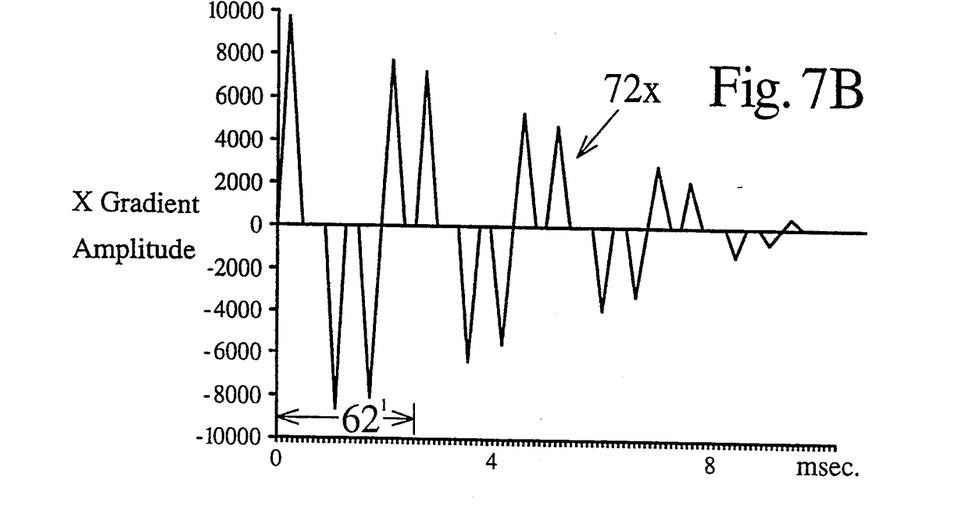
Figure 7C:
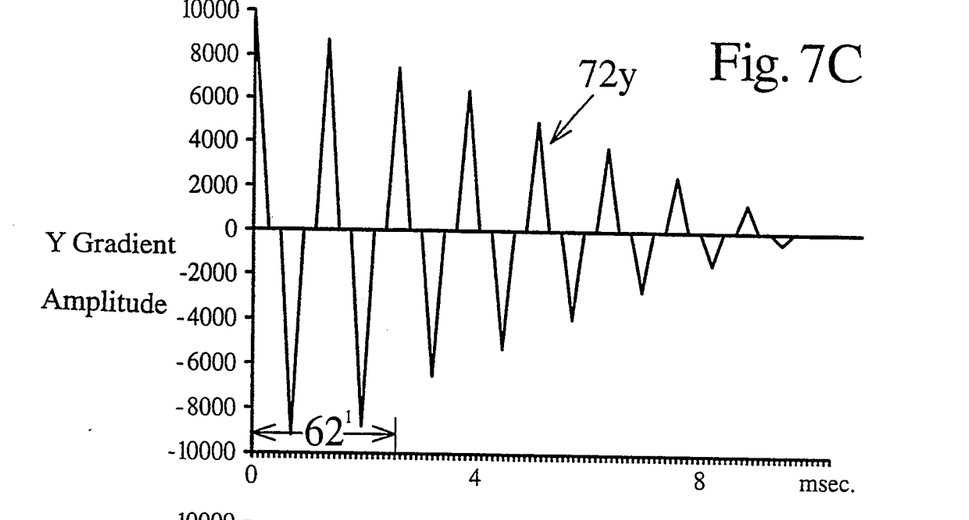
Figure 7D:
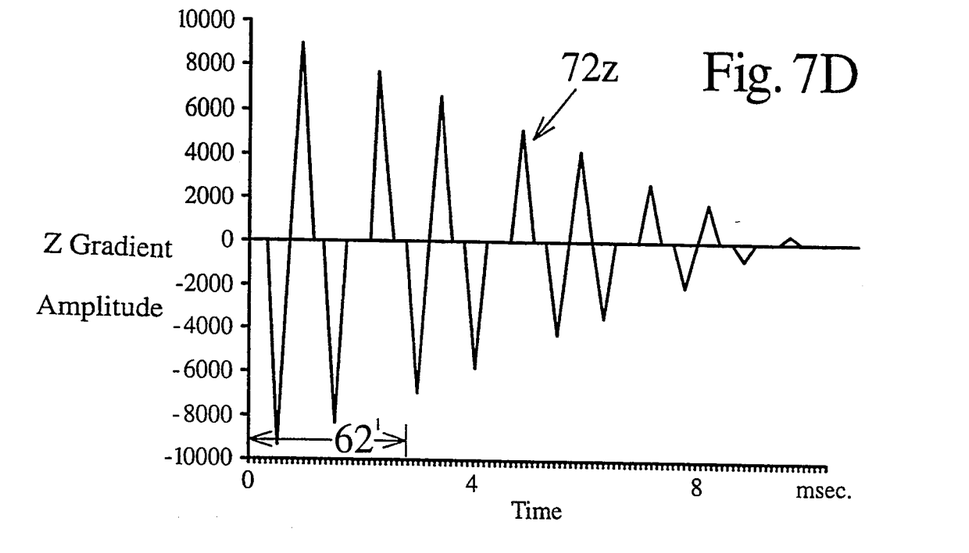
Figure 8:
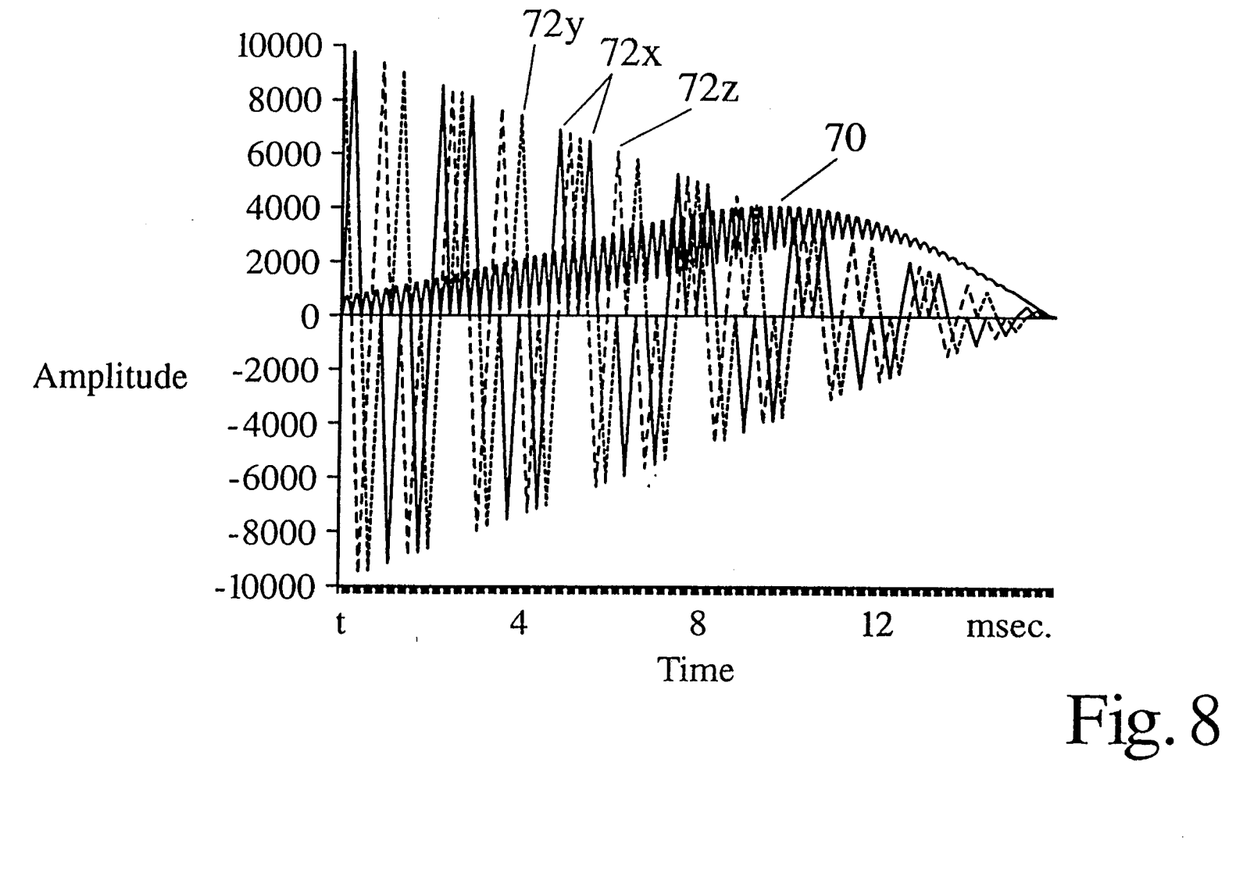
FIG. 8 is a superimposition of RF and gradient pulses analogous to FIGS. 7A–7D but for a six layer octahedral trajectory.

With reference to FIGS. 7A, 7B, 7C, 7D, and 8, the limited region excitation means generates an RF pulse 70 of about 10 msec. as illustrated in FIG. 7A. The x-gradient control means 54 and the y-gradient control means 56 apply x and y-gradients $72x$, $72y$ as illustrated in FIGS. 7B and 7C, respectively. A z-gradient means 74 causes a series of z-gradients $72z$ to be applied as illustrated in FIG. 7D. As can be seen from FIG. 8 which is the superimposition of the RF and gradient pulses of FIGS. 7A–7D but with six cycles instead of four cycles, there are twelve RF pulses for each cycle 62 of the gradients to cause the trajectory to follow the twelve linear subtrajectories between apices of the octahedron of FIG. 6. With the present preferred embodiment, each apex is visited twice per cycle, once during the first six legs of the trajectory and again during the second six legs of the trajectory. In the FIG. 7A–7D embodiment, there are four cycles of the gradients such that the trajectory decays along four progressively smaller octahedral layers. In the embodiment of FIG. 8, there are six cycles such that the trajectory decays along six progressively smaller octahedral layers.

The octahedral spiral k-space trajectory is best constructed by considering the equation of a straight line in spherical polar coordinates. Each leg of the trajectory is considered separately and the time is considered cumulatively to insure that no amplitude discontinuities exist.

K-space k(t) is limited to gradient space G(t) by:

$$k(t) = -\gamma \int_t^T G(s)ds. \quad (3)$$

Because all three coordinate axes in k-space are related to the three Cartesian axes of gradient space by a simple rotation, the trajectories can be described in gradient space.

Any leg of the gradient trajectory can be expressed in terms of the amplitude of the two contributing gradients i and j:

$$G_i(t) = A(1-t/T)[b/(\sin\theta - m^*\cos\theta)]\cos\theta \quad (4a),$$

$$G_j(t) = A(1-t/T)[b/(\sin\theta - m^*\cos\theta)]\sin\theta \quad (4b),$$

where:
A is an arbitrary amplitude;
t is the time of the point being calculated;
T is the total time of the gradient waveform;
$\theta$ is the polar angle of the calculated point;
m and b are the slope and intercept of the sides of the square spiral and can take on the following values: $m = \pm 1$, $b = \pm 1$.

The RF pulse, with a Gaussian shape, is calculated on a point by point basis from the three-dimensional gradient space trajectory by:

$$B_1(t) = A_{rf} * e^{-\sigma^2(k_x^2 + k_y^2 + k_z^2)}[(2\pi n(1-t/T)^2 + 1)]^{\frac{1}{2}} \quad (5),$$

where:
$A_{rf}$ is a scaling factor to adjust the tip angle;
n is the number of cycles in the spiral;
$\sigma$ is the standard deviation of the Gaussian profile;
t and T are defined as above.

Figure 9:
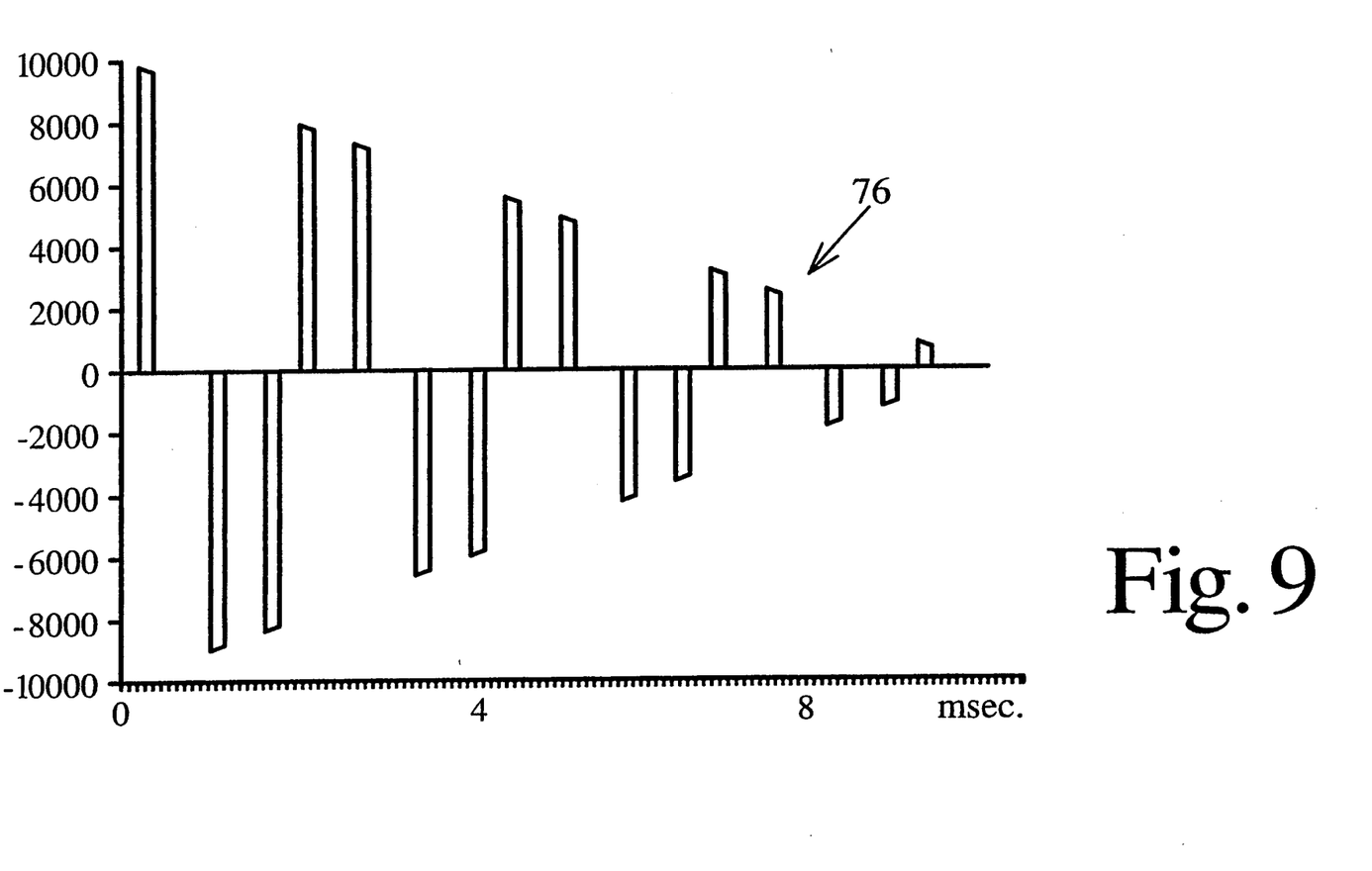
FIG. 9 is a series of offset gradient pulses for shifting the center of excitation along the x-axis of FIG. 7B.

With reference to FIG. 9, the location of the limited resonance excitation subregion is selectively positioned with offset profiles 76 analogous to frequency offset profiles 66 illustrated in FIG. 2D. The analogous frequency offset profiles 76 are applied in the three-dimensional case in accordance with a location input by the operator with the location selection means 48. The offset axis is rotated into alignment with the selected location and the amplitude of the frequency offset profiles 76 are adjusted in accordance with the selected displacement along the rotated axis from the isocenter. The size of the subregion of excitation can be adjusted by adjusting amplitude of the gradient waveforms. Additional octahedral spirals may be added to cause a more homogeneous coverage of k-space.

Figure 10:
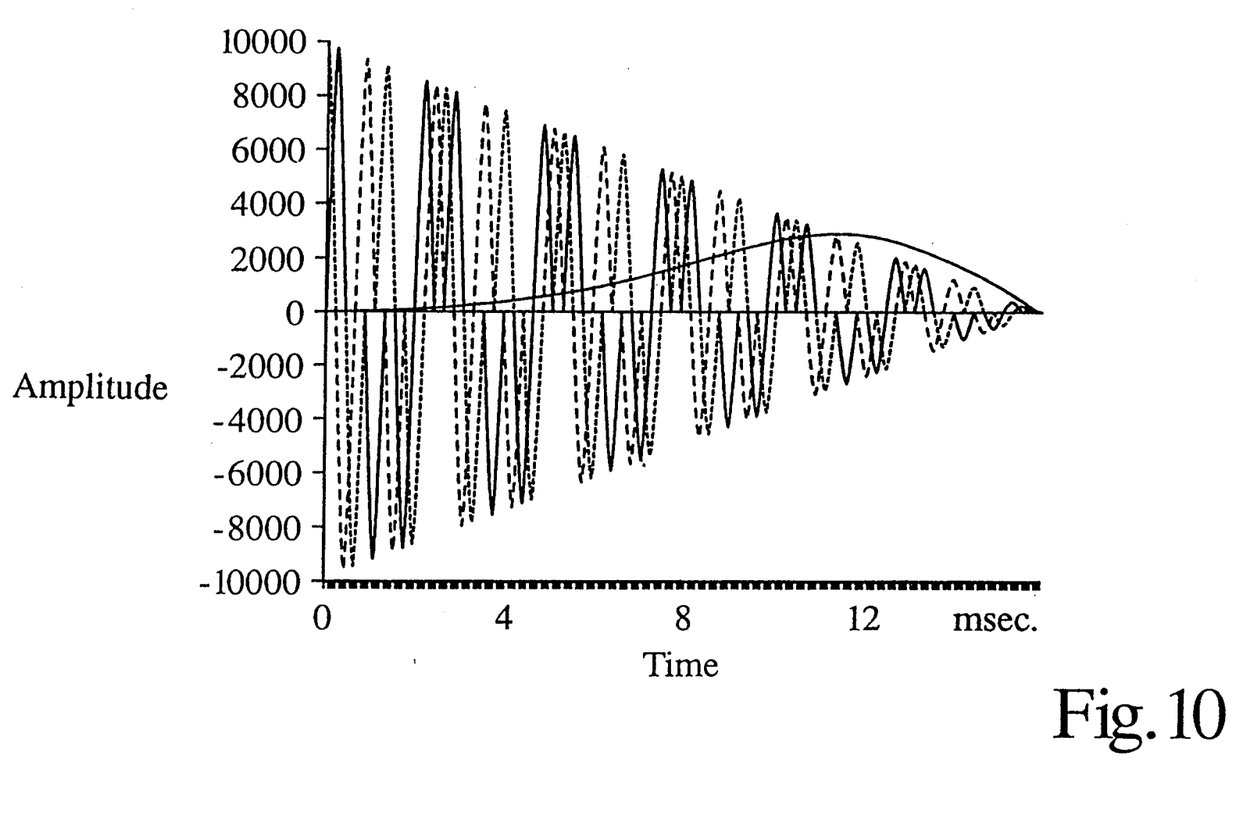
FIG. 10 is a series of RF and gradient pulses for defining a spherically spiralling k-space trajectory analogous to a ball of string.

As yet another alternative, the three-dimensional trajectory may be than other than a piecewise linear trajectory. For example, a curvilinear trajectory such that $R^2 = (G_x^2 + G_y^2 + G_z^2)$, where the magnitude of R follows that of the equi-angular spiral, may also be used. This changes the octahedral spiral to a spherical spiral which could follow the spherically spiral windings found on a ball of yarn or the interior or a baseball. FIG. 10 illustrates appropriate gradient and RF pulses to create a spherically spiral trajectory. Of course, with the spherically spiral trajectory, movement of the subregion of excitation requires shifting the phase of the RF pulse rather than applying frequency offset profiles pulses.

As other alternatives, the three-dimensional spiral may move among the apices of other regular solids such as a tetrahedron, a cube, a dodecahedron, and an icosahedron.

With reference again to FIG. 1, in one mode of operation, the operator selects a conventional flow imaging sequence and selects an adjacent region, such as the region through a major artery, to be saturated. Each repetition of the conventional flow imaging sequence is preceded by a selective saturation pulse. That is, the selective saturation pulse includes an RF pulse and gradient sequence as described above to saturate the selected region, e.g. through the adjacent artery. As each magnetic resonance echo is received, it is conveyed to a buffer memory 80 and digitized by an analog-to-digital converter 82. The digitized data lines are stored in a data memory 84. Once a full set of data is collected, it is reconstructed by an inverse two-dimensional Fourier transform or other conventional image reconstruction means 86 into an electronic image representation. The electronic image representation, which is stored in an image memory 88, is converted by a video processor 90 into appropriate format for display on a video monitor 92.

In another mode of operation, the present invention is used to limit the region of examination. More specifically, the operator selects a conventional magnetic resonance imaging sequence and designates the region to be imaged. In the conventional magnetic resonance imaging sequence, each RF excitation pulse is replaced with an RF pulse and gradient as described above. By using the size and location adjustment means 46, 48, the operator can select the limited region within which resonance is to be excited. The resultant magnetic resonance echo signals emanating from the limited region are again received by the buffer 80, digitized, and reconstructed into an electronic image representation.

In imaging sequences which use a refocusing RF pulse or other magnetic resonance manipulating RF pulses, one or more of the additional RF pulses may also be configured with the RF and gradient combinations described above. For example, in a spin echo technique, resonance may be excited in a relatively large region. By applying a 180° refocusing pulse to only a limited region using the technique described above, the resultant magnetic resonance echo will be limited to magnetic resonance from the region to which the refocusing pulse was limited. In this manner, region specific imaging is achieved. Analogously, other imaging techniques may utilize the present invention to saturate a limited region, excite resonance in a limited region, manipulate resonance in a limited region, or the like.

The invention has been described with reference to the preferred embodiment. Obviously, modifications and alterations will occur to others upon reading and understanding the preceding detailed description. It intended that the invention be construed as including all such modifications and alterations insofar as they come within the scope of the appended claims or the equivalents thereof.

Having thus described the preferred embodiment, the invention is now claimed to be:

1. A method of exciting magnetic resonance in a limited subregion of an examination region, the method comprising:

creating a static magnetic field through an examination region;

concurrently transmitting a series of temporally contiguous radio frequency pulses and excitation select gradient pulses into the examination region, the series of contiguous radio frequency pulses taken together control a magnetic resonance excitation tip angle, the excitation select gradient pulse and the radio frequency pulses interact to cause magnetic resonance to be excited along a k-space trajectory that follows a piecewise linear spiral.

2. The method as set forth in claim 1 further including applying a series of frequency offset profiles generally concurrent with the excitation select gradient pulses along a first axis, amplitudes of the frequency offset pulses controlling shifting of the excitation subregion along the firs axis.

3. The method as set forth in claim 2 wherein the series of frequency offset profiles diminish in amplitude linearly.

4. The method as set forth in claim 3 wherein the excitation select gradient pulses are applied along three mutually orthogonal axes such that the trajectory follows a three-dimensional piecewise linear spiral.

5. The method as set forth in claim 4 wherein the k-space trajectory follows along an octahedral spiral.

6. The method as set forth in claim 1 wherein each radio frequency pulse of the series of radio frequency pulses has the same duration and wherein the excitation select gradient pulses include:

x-gradient pulses which oscillate in polarity with a periodicity such that each cycle of the x-gradient pulses is an integer multiple of radio frequency pulses; and y-gradient pulses which oscillate in polarity with a periodicity such that each cycle of the y-gradient pulses is an integer multiple of radio frequency pulses.

7. The method as set forth in claim 6 wherein the x and y-gradient pulses diminish linearly in amplitude.

8. The method as set forth in claim 7 further including displacing the limited subregion along one of the first and second axes by applying a positive frequency offset profile of a positive polarity concurrently with each positive gradient pulse along the selected axis and applying a negative frequency offset profile concurrently with each excitation select gradient pulse along the selected axis, the positive and negative frequency offset profiles each having substantially the same duration as one of the radio frequency pulses.

9. The method as set forth in claim 8 wherein the series of excitation select gradient pulses further includes a series of z-gradient pulses.

10. The method as set forth in claim 7 wherein the excitation select gradient pulses include a series of z-gradient pulses, the z-gradient pulses cyclically alternating polarity with a periodicity which is an integer ratio of the radio frequency pulses, the z-gradient pulses diminishing linearly in amplitude.

11. A method of exciting magnetic resonance in a limited subregion of an examination region, the method comprising:

creating a static magnetic field through an examination region;

concurrently transmitting a series of radio frequency pulses and excitation location selection gradient pulses into the examination region, the radio frequency pulses each having a common duration and being immediately temporally contiguous such that the combination of the radio frequency pulses taken together control a magnetic resonance tip angle, the series of excitation location selection pulses including a series of x-gradient pulses including positive and negative x-gradient pulses having a fixed cyclic periodicity, which x-gradient periodicity is an integer multiple of the radio frequency pulses, the x-gradient pulses having amplitudes which diminish linearly over a temporal duration of the radio frequency pulse series, a series of y-gradient pulses including positive and negative y-gradient pulses having a fixed cyclic periodicity, which y-gradient periodicity is an integer multiple of the radio frequency pulses, the y-gradient pulses having amplitudes which diminish linearly over the temporal duration of the radio frequency pulse series, a series of z-gradient pulses including positive and negative z-gradient pulses having a fixed cyclic periodicity, which z-gradient periodicity is an integer multiple of the periodicity of the radio frequency pulses, the z-gradient pulses having amplitudes which diminish linearly over the temporal duration of the radio frequency pulse series, whereby magnetic resonance is excited along a k-space trajectory which spirals symmetrically inward in three dimensions.

12. The method as set forth in claim 11 further including applying a series of frequency offset profiles concurrently with gradient pulses of a selected one of the x, y, and z-gradient pulse series to displace the limited region of excitation along the selected axis.

13. The method as set forth in claim 12 further including adjusting the amplitude of the frequency offset profile to control a distance along the selected axis which the limited subregion is displaced.

14. The method as set forth in claim 12 wherein the series of frequency offset profiles diminish linearly in amplitude over the duration of the radio frequency pulse series.

15. A method of exciting magnetic resonance in a limited subregion of an examination region, the method comprising:

creating a static magnetic field through an examination region;

concurrently transmitting a series of temporally contiguous radio frequency pulses having a radio frequency pulse series periodicity and applying a series of excitation subregion selection gradient pulses into the examination region along at least first and second axes, the series of excitation subregion selection gradient pulses having a periodicity which is an integer multiple of the radio frequency pulse series periodicity, the series of contiguous radio frequency pulses and the series of excitation subregion selection gradient pulses interacting to cause magnetic resonance to be excited along a k-space trajectory that follows a piecewise linear spiral;

displacing the selected subregion within which magnetic resonance is excited along a selected one of the axes by applying a frequency offset profile concurrently with each excitation subregion selection gradient pulse along the selected axis, each frequency offset profile being concurrently with and having the same duration as one the radio frequency pulse pulses.

16. The method as set forth in claim 15 further including adjusting the amplitude of the frequency offset profile to adjust a displacement distance along the selected axis 17. The method as set forth in claim 16 wherein the amplitudes of the excitation subregion selection gradient pulses and the frequency offset profile diminish linearly over the duration of the series of radio frequency pulse series.

18. The method as set forth in claim 16 wherein the step of applying the series of excitation location selection gradient pulses further includes cyclically applying gradient pulses along a third axis with a cyclic periodicity which is the same integer multiple of the radio frequency pulse series periodicity as the cyclic periodicity of the gradient pulses along the first and second axes, the radio frequency pulses and the excitation subregion selection gradient pulses along the three axes being selected such that the magnetic resonance is excited along a k-space trajectory which follows a three-dimensional piecewise linear spiral.

19. An apparatus for exciting magnetic resonance in a limited subregion of an examination region, the apparatus comprising:

a means for creating a static magnetic field through an examination region;

a means for concurrently transmitting a series of temporally contiguous radio frequency pulses and for applying a series of excitation location selection gradient pulses along at least first and second orthogonal axes into the examination region such that the series of radio frequency pulses and the series of excitation location selection gradient pulses interact to cause magnetic resonance to be excited along a k-space trajectory that follows a piecewise linear spiral.

20. An apparatus for exciting magnetic resonance in a limited subregion of an examination region, the apparatus comprising:

a means for creating a static magnetic field through an examination region;

means for transmitting a series of radio frequency pulses into the examination region, the radio frequency pulses each having a common duration and being immediately temporally contiguous such that the combination of the radio frequency pulses taken together control a magnetic resonance tip angle;

a means for applying excitation subregion selection gradient pulses across the examination region, the series of excitation subregion selection pulses including a series of x-gradient pulses including positive and negative x-gradient pulses, a series of y-gradient pulses including positive and negative y-gradient pulses and a series of z-gradient pulses including positive and negative z-gradient pulses;

a control means for controlling the means for transmitting radio frequency pulses and the gradient applying means such that the x, y, and z-gradient pulse series have a periodicity which is an integer multiple of the radio frequency pulse duration, the x, y, and z-gradient pulses having amplitudes which diminish linearly over the temporal duration of the radio frequency pulse series, whereby magnetic resonance is excited along a k-space trajectory which spirals symmetrically inward in three dimensions.

21. An apparatus for exciting magnetic resonance in a limited subregion of an examination region, the apparatus comprising:

a means for creating a static magnetic field through an examination region;

a means for transmitting a series of temporally contiguous radio frequency pulses each of a common duration into the examination region;

a means for applying a series of limited subregion selection gradient pulses across the examination region along at least two axes;

a control means for controlling the radio frequency transmitting means and the gradient applying means such that the series of limited subregion selection gradient pulses have a periodicity which is an integer multiple of the common duration of the radio frequency pulses, the series of contiguous radio frequency pulses and the series of limited subregion selection gradient pulses interacting to cause magnetic resonance to be excited along a k-space trajectory that follows a piecewise linear spiral;

a means for displacing the limited subregion along a selected one of the axes, the displacing means controlling the gradient applying means and the radio frequency pulse transmitting means to apply an offset gradient pulse concurrently with each limited subregion selection gradient pulse along the selected axis.

* * * * *